United States Patent [19]

Theriault et al.

[11] Patent Number: 4,679,302

[45] Date of Patent: Jul. 14, 1987

[54] DOUBLE POLYSILICON INTEGRATED CIRCUIT PROCESS

[75] Inventors: Robert E. Theriault, Ottawa; John G. Hogeboom, Nepean, both of Canada

[73] Assignee: Northern Telecom Limited, Montreal, Canada

[21] Appl. No.: 861,887

[22] Filed: May 12, 1986

[51] Int. Cl.$^4$ .................. H01L 27/04; H01L 29/78
[52] U.S. Cl. ................... 29/571; 29/576 C
[58] Field of Search ............ 357/23.6; 29/571, 576 C

[56] References Cited

U.S. PATENT DOCUMENTS

| | | | |
|---|---|---|---|
| 3,387,286 | 6/1968 | Dennard | 148/187 X |
| 3,996,658 | 12/1976 | Takei et al. | 29/571 |
| 4,021,789 | 5/1977 | Furman et al. | 148/187 X |
| 4,080,718 | 3/1978 | Richman | 29/571 |
| 4,261,772 | 4/1981 | Lane | 148/174 |
| 4,350,536 | 9/1982 | Nakano et al. | 148/1.5 |
| 4,397,077 | 8/1983 | Derbenwick et al. | 29/571 |
| 4,466,177 | 8/1984 | Chao | 29/571 |
| 4,577,390 | 3/1986 | Haken | 29/570 |

OTHER PUBLICATIONS

Klepner et al., IBM Tech. Disc. Bull., V. 19, No. 2 (Jul. 1976), pp. 458–459.
Rideout, IBM Tech. Disc. Bull., V. 21, No. 9 (Feb. 1979), pp. 3823–3825.
Lu, IBM Tech. Disc. Bull., V. 26, No. 3B (Aug. 1983), pp. 1318–1322.

Primary Examiner—Olik Chaudhuri
Attorney, Agent, or Firm—John E. Mowle

[57] ABSTRACT

In a double polysilicon integrated circuit processing method a first level polysilicon is used for FET gate fabrication, a second level is used for interconnection and both levels are used in the fabrication of analog capacitors over field oxide regions. By the invention, capacitors are also fabricated in the FET device well by implanting dopant through the second level polysilicon at the same time that dopant is implanted directly into other regions of the substrate to a greater depth and dopant level concentration so as to function as an FET source. The method is particularly adapted to fabricating DRAM memories.

7 Claims, 6 Drawing Figures

DOUBLE POLYSILICON INTEGRATED CIRCUIT PROCESS

This invention relates to a double polysilicon integrated circuit fabrication process particularly for making a dynamic RAM.

A memory cell consisting of an FET and a capacitor is disclosed in U.S. Pat. No. 3,387,286 (Dennard). The FET serves as an input transistor to control both the charging of the capacitor during writing and the interrogation of the capacitor during reading. A memory is formed of an array of such cells controlled for reading and writing by word and bit lines which are connected to the cells. During a write operation, the word line which is connected to the FET gate electrode is energized to render the transistor conductive between the FET source and drain. Conduction occurs when the gate voltage exceeds the voltage at the source terminal by the threshold voltage of the transistor.

If a "0" is to be stored, the bit line which is connected to the source is not energized and the capacitor is not charged. If a "1" is to be stored, the bit line is energized and the capacitor is charged. The write signal on the word line is maintained for a time sufficient to fully charge the capacitor. Then the word line voltage is terminated and the FET is cut off and presents a high impedance to the charge circuit.

During read operations only the word line is energized and a signal is transmitted to the bit line if a "1" has been stored previously to charge the capacitor.

Frequently, integrated circuits are desired which do not consist wholly or even primarily of memory but which may include among other elements analog circuits including analog capacitors. An advantage of the double polysilicon fabrication process is that capacitors for use in analog circuits can be fabricated over field oxide regions. The large poly-to-poly capacitors are ideal for analog applications since they have low noise, large capacitance, a low parasitic capacitance-to-nominal capacitance ratio, and low voltage dependence.

However, such capacitors are not particularly for use within memory devices. For digital applications, noise and large capacitance are not as important and therefore, the less area intensive p-n junctions may be used. A capacitor for use in a DRAM is normally fabricated in the device well at a position immediately adjacent to the controlling FET. The FET drain is made integral with a doped substrate region functioning as one side of a parallel plate capacitor, with an oxide layer over the doped region, and a top layer of polysilicon overlying the oxide and functioning as the capacitor top plate.

Double polysilicon implementations of the FET-capacitor memory cell, are known for example from Japanese Patent Application Nos. 51;114079 and JPA 51;118969, German Patent Application DRA No. 2532594, JPA No. 52;098486, JPA No. 52;079679 and U.S. Pat. No. 4021789. In these examples, the first level of polysilicon generally serves as one plate of a parallel plate capacitor and a second level polysilicon partially overlapping the first, generally forms a transfer gate.

A double polysilicon process which minimizes the number of process steps required to produce both analog capacitors and DRAM capacitors on a common integrated circuit chip is now proposed.

A method according to the present invention comprises:
(i) taking a silicon wafer;
(ii) forming field oxide regions therein;
(iii) forming a gate oxide layer over a device region of the wafer not covered by the field oxide, said device region having source, gate, and capacitor areas;
(iv) depositing a first polysilicon layer;
(v) etching the polysilicon to form a transistor gate over said gate area;
(vi) forming a second oxide layer over the gate and the surrounding device region;
(vii) depositing a second polysilicon layer;
(viii) etching the second polysilicon layer to leave polysilicon over said capacitor area; and
(ix) in a single implantation step, implanting ions through said second oxide layer into said source area to form a transistor source, and through said oxide and second polysilicon layer to define one side of a capacitor at said capacitor area, said second level polysilicon functioning as an opposed side of the capacitor, and part of said second oxide layer functioning as the capacitor dielectric, the penetration depth of ions into the capacitor area being substantially shallower than the penetration depth of ions into the source area.

The method can be adapted for the fabrication of integrated circuit chips having analog capacitors and DRAM capacitors. Thus when etching said first level polysilicon to form the transistor gate, a region of said first level polysilicon is defined over the field oxide. When forming said second level oxide in the device region, a region of said second level oxide is formed over said first level polysilicon region, and when etching said second level polysilicon, a corresponding region thereof is defined over said second level oxide region. The regions of polysilicon and the intervening oxide region comprise the structure of an analog capacitor which can be suitably incorporated into the integrated circuit chip.

The method can be performed using a p-type substrate and n-type implanted ions. Suitably the n-type ion implantation includes a dose of arsenic ions and a dose of phosphorus ions.

The implantation into the source area of the substrate preferably produces a doped region with sheet resistance of the order of 50 ohm per square and the implantation into the capacitor area preferably produces a doped region with sheet resistance of the order of 650 ohm per square. To ensure adequate penetration of ions at the capacitor area, the second layer of polysilicon is preferably relatively thin, of the order of 1000 Angstrom units in comparison to the first level polysilicon which is preferably of the order of 4000 Angstrom units.

An embodiment of the invention will now be described by way of example with reference to the accompanying drawings in which:

The Figures show stages in the fabrication of an integrated circuit having an analog capacitor formed over a field oxide region and a DRAM memory cell consisting of an FET and capacitor formed within a device well.

DETAILED DESCRIPTION OF THE FIGURES

Figure 1:
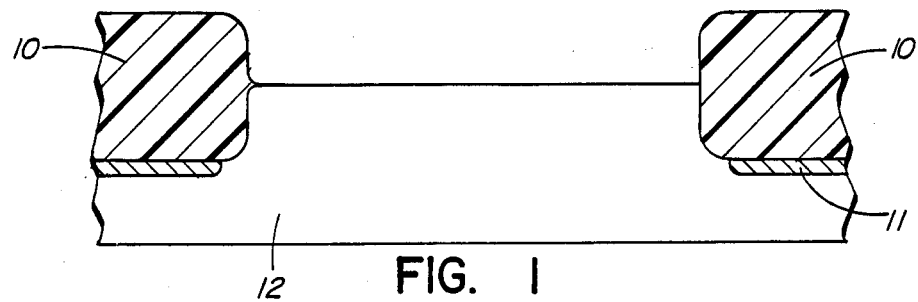
FIGS. 1 through 6 are sectional views, not to scale, showing successive stages in a double polysilicon process according to the invention.

In the exemplary method, a known LOCOS technique is used to thermally grow field oxide regions 10 through a nitride mask (not shown) on p-type silicon wafer 12. During oxidation, silicon is consumed so the resulting field oxide is inset into the silicon compared to the silicon surface level under the nitride mask. As the oxide grows, it pushes a channel stop dopant implant 11 below the field oxide regions into the silicon. The nitride is then removed to produce the stage shown in FIG. 1.

Figure 2:
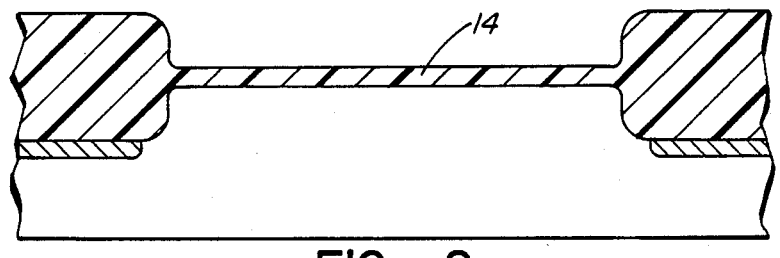

Referring to FIG. 2 a 700 Angstrom unit sacrificial oxide layer (not shown) is grown and is removed back to the silicon. A second gate oxide layer 14 is then grown. The double gate oxidation is performed to obtain a gate oxide layer devoid of oxynitride impurities at the boundary of the device active regions. Following an implant to adjust the threshold voltage of device active areas, a 0.45 micron layer of polysilicon is deposited. The polysilicon is doped from a POCl$_3$ source.

Figure 3:
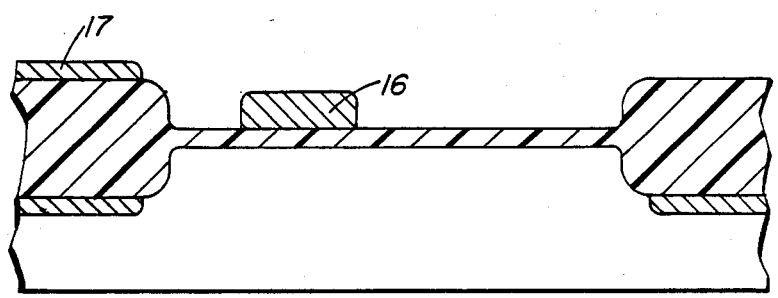
Figure 4:
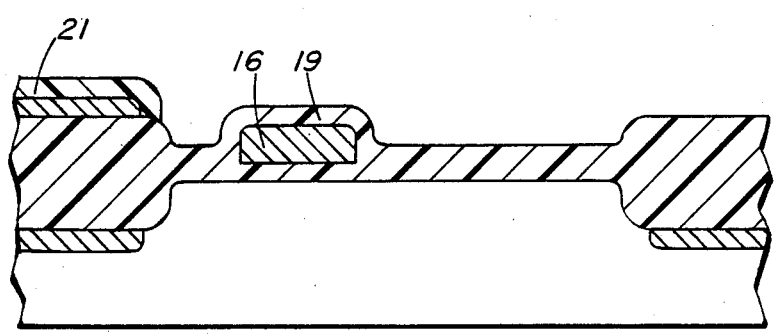
Figure 5:
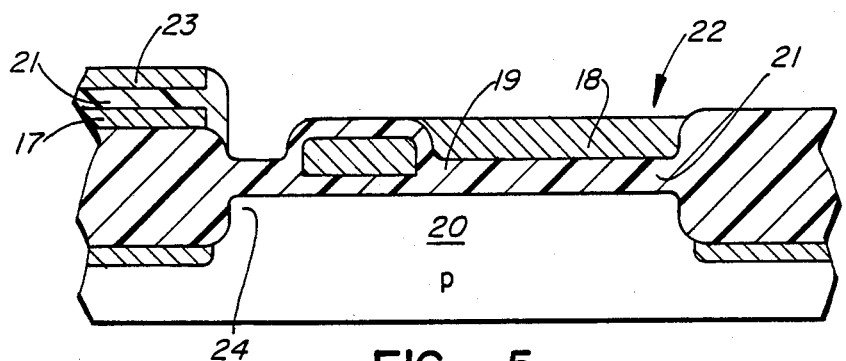

In a further photoengraving step, gate regions 16 and analog capacitor bottom plates 17 are defined in the polysilicon (FIG. 3). The gate regions and surrounding device active areas are oxidized to insulate gate 16 and to form analog capacitor dielectric 21 (FIG. 4). A further polysilicon layer 1000 Angstrom units in thickness is then deposited over the wafer. The second polysilicon layer is doped from a POCl$_3$ source and is etched so that a part 18 remains over the oxide at an intended capacitor site 22 and a top polysilicon capacitor plate 23 also remains over oxide region 21 for the analog capacitor over the field oxide (FIG. 5).

Figure 6:
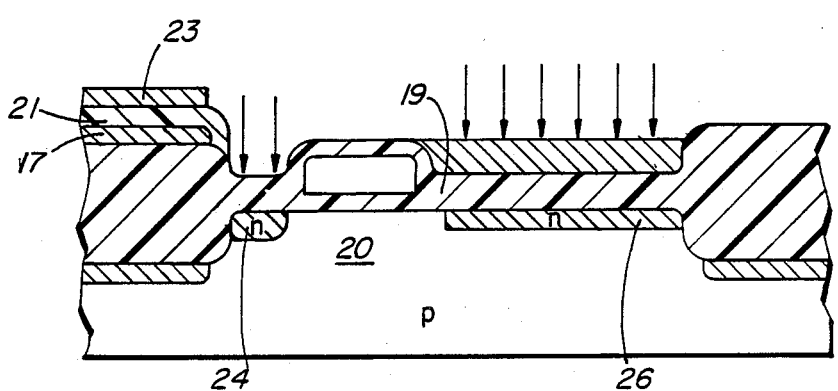

Referring to FIG. 6, a double implant is then performed consisting of an arsenic ion implantation with a dose of $7\times10^{15}$ and an energy of 100 keV followed by a phosphorus ion implantation with a dose of $3\times10^{14}$ and an energy of 100 keV. The double n+ implant is used to help reduce the electric field at the drain region during device operation. Arsenic is a slow diffuser, thus giving a shallow low resistance n+ region. The resulting steep profile, however, has the disadvantage of generating a high electric field, which in turn leads to 'hot carrier' phenomena (such as impact ionization and injection of carriers into the gate oxide). Adding a small amount of phosphorus tapers the doping profile, reducing the electric field.

The implanted ions are directed through both the oxide layer 19 and the polysilicon region 18 unite to produce the doped substrate region 26. The region 26 and the polysilicon region 18 function as opposed plates of a parallel plate capacitor. In contrast, the implanted ions are directed only through an oxide layer to produce the source region 24. Consequently at the capacitor site, the implanted n-type ions produce a junction typically at a depth of 1700 Angstrom units and a sheet resistance of 650 ohm per square. At the source region, the implanted n-type ions produce a junction about 0.3 microns deep and a sheet resistance of 50 ohm per square.

In addition, dopant concentration at the source is very high, of the order of $10^{19}$/cc, at the substrate surface which is desirable in order that a good aluminum contact can be made. Furthermore, the oxide at the capacitor site is shadowed from the energetic ions by the polysilicon region 18. Consequently, the oxide is not unduly damaged and its breakdown voltage remains high.

If the device is a CMOS device, then corresponding processing takes place in n-doped wells to form p-channel devices. During this process, n-channel devices are masked by photoresist. In both cases field oxide and gate regions define the areas of the source and capacitor implants in the substrate.

Further fabrication steps are conventional. Phosphosilicate glass is deposited over the wafer and, following an annealing step, contacts are opened to the source and gate. Aluminum is deposited and photodefined to produce interconnects including leads from contact pads at the perimeter of the wafer to the source and gate regions. For a DRAM memory, the leads link the gates of the transistors in columns of a row-column array by a word line and to link the sources of each transistor row by a bit line.

The method of the invention permits an adaptation of a conventional MOS double polysilicon process whereby with no additional process steps, capacitors can be produced within device wells, for example, for implementing DRAM cells.

The double polysilicon process itself is normally selected as an integrated circuit fabrication vehicle because it offers certain circuit possibilities in an integrated circuit. In particular, the two polysilicon layers can be used at field oxide sites to fabricate large capacitors for use in analog circuits. The two poly levels also find application in stacked gate EEPROMs.

What is claimed is:

1. A double polysilicon integrated circuit processing method comprising:
   (i) taking a silicon wafer;
   (ii) forming field oxide regions therein;
   (iii) forming a gate oxide layer over a device well region, said device well region having source, gate and capacitor areas;
   (iv) depositing a first polysilcon layer over the gate oxide layer;
   (v) etching the polysilicon to form a transistor gate over said gate area;
   (vi) forming a second oxide layer over the gate and the surrounding device region;
   (vii) depositing a second polysilicon layer over the second oxide layer;
   (viii) etching the second polysilicon layer to leave polysilicon over said capacitor area; and
   (ix) in a single implantation step, implanting ions through said second oxide layer into said source area to form a transistor source and through said oxide and second polysilicon layers to define one side of a capacitor at said capacitor area, said second level polysilicon at the capacitor area functioning as an opposed side of the capacitor, and the second oxide layer at the capacitor area functioning as a capacitor dielectric, the junction depth and concentration of ions in the capacitor area being less than the junction depth and concentration of ions in the source area.

2. A method as claimed in claim 1 wherein when etching said first level polysilicon to form the transistor gate, a region of said first level polysilicon is defined over the field oxide, when forming said second level oxide in the device region, a region of said second level oxide is formed over said first level polysilicon region, and when etching said second level polysilicon, a region thereof is defined over said second level oxide region, said regions of polysilicon and said oxide region comprising an analog capacitor.

3. A method as claimed in claim 1 wherein the substrate is a p-type substrate and the ions implanted are n-type.

4. A method as claimed in claim 3 wherein the ions implanted include a dose of arsenic ions and a dose of phosphorus ions.

5. A method as claimed in claim 1 wherein the implantation into the source area through oxide alone produces a doped region with sheet resistance of the order of 50 ohms per square and implantation into the capacitor area through oxide and polysilicon produces a doped region with sheet resistance of the order of 650 ohms per square.

6. A method as claimed in claim 1 in which the second layer of polysilicon is of a thickness substantially less than that of the first layer of polysilicon.

7. A method as claimed in claim 6 in which the first layer of polysilicon is of the order of 4000 Angstrom units thick and the second polysilicon layer is of the order of 1000 Angstrom units thick.

* * * * *